United States Patent
Seo et al.

(10) Patent No.: US 7,456,773 B1
(45) Date of Patent: Nov. 25, 2008

(54) PSEUDO-DIFFERENTIAL CLASS-AB DIGITAL-TO-ANALOG CONVERTER WITH CODE DEPENDENT DC CURRENT

(75) Inventors: Dongwon Seo, San Diego, CA (US); Bo Sun, Carlsbad, CA (US); Gurkanwal S. Sahota, San Diego, CA (US); Manu Mishra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/762,884

(22) Filed: Jun. 14, 2007

(51) Int. Cl.
*H03M 1/68* (2006.01)
(52) U.S. Cl. ........................ 341/145; 341/144
(58) Field of Classification Search .............. 341/144, 341/145, 153
See application file for complete search history.

(56) References Cited

U.S. PATENT DOCUMENTS 5,017,918 A * 5/1991 Matsusako .............. 341/145
5,646,620 A * 7/1997 Regier .................... 341/118
6,246,351 B1 * 6/2001 Yilmaz .................... 341/145
7,227,483 B2 * 6/2007 Seo ......................... 341/144

FOREIGN PATENT DOCUMENTS

EP        287312 A2 * 10/1988
JP      03213018 A  *  9/1991

* cited by examiner

*Primary Examiner*—Howard Williams
(74) *Attorney, Agent, or Firm*—Donald C. Kordich; William Marcus Hooks; Thomas R. Rouse

(57) ABSTRACT

A digital-to-analog converter, RF transmit channel and method, for converting a digital signal of N bits having a set M of most significant bits and a set L of least significant bits to an analog signal, are disclosed. The digital signal defines a set of coded values which are converted to analog values and modulated on to a RF signal. The digital-to-analog converter includes a plurality of switches and an output stage, for providing at least a first differential output signal and a second differential output signal. The output stage modifies currents received from the plurality of switches, such that the value of the average output current of the first and second differential outputs signals is steered to a relatively low current value at the mid-point of the coded values.

22 Claims, 7 Drawing Sheets

Pseudo-Differential DAC

Conventional Fully Differential DAC

PSEUDO-DIFFERENTIAL CLASS-AB DIGITAL-TO-ANALOG CONVERTER WITH CODE DEPENDENT DC CURRENT

FIELD OF DISCLOSURE

The embodiments of the invention relate generally to digital-to-analog converters, and more specifically to a digital-to-analog converter having a fully differential mode and a pseudo-differential mode.

BACKGROUND

Digital-to-analog converters (hereinafter referred to as "DACs") are widely used for various applications including wireless communication. For example, a wireless communication device typically includes a transmit DAC ("TxDAC") to convert one or more digital data streams into one or more analog signals. The analog signals are further processed to generate a radio frequency (RF) output signal that is suitable for transmission over a wireless channel. The TxDAC is typically designed to meet stringent dynamic specifications for spurious free dynamic range (SFDR), signal-to-noise ratio (SNR), total harmonic distortion (THD), and the like. These dynamic specifications determine the quality (e.g., spectral purity) of the analog signals from the TxDAC and are normally set such that the RF output signal can meet the overall specifications imposed by the wireless system.

An example of such a DAC is described in U.S. Published Patent Application 20060061499, entitled "High-speed and high-accuracy digital-to-analog converter", by Seo, published on Mar. 23, 2006, and assigned to the assignee of the present application. The entire contents of U.S. Published Patent Application 20060061499 are herein incorporated by reference.

Referring now to FIG. 1, a block diagram illustrates an embodiment of the high speed DAC 100. The DAC 100 is preferably an N-bit DAC, where N may be any integer value (e.g., N=12). In one embodiment, the N-bit DAC 100 is implemented with two thermometer decoders 101 and 102. Thermometer-decoder 101 controls M most significant bits, and thermometer decoder 102 controls L least significant bits, where L and M may be any integer values such that L+M=N (e.g., L=5, M=7, and N=12). Preferably, the M bit section of DAC 100 includes a latches/drivers 103, switches 105, a current bias 107 and a MSB current source 109, and the L bit section of DAC 100 includes a latches/drivers 104, switches 106, a cascode bias 108 and a LSB current source 110. The DAC 100 includes two differential output signals OUTP (output plus) and OUTM (output minus)

Referring now to FIG. 2, a simplified block diagram illustrates the DAC 100 implemented in a conventional Tx channel of a wireless device. The outputs of the DAC 100 include fully-differential current outputs OUTP and OUTM. This means for a given output power the total DACs' DC current is always constant. This results in constant DC current in succeeding stages of FIG. 2, such as baseband transmit filter 201 and up-conversion mixer 202 because of the inherent property in the current mirroring stage. In the simplified transmit chain of FIG. 2 the transmit filter 201 may be a 1-pole passive baseband (BB) filter, but the order of this filter is generally greater than or equal to 2 (e.g., 2 or 3). "N" represents the current mirror gain of the filter stages. A similar current gain may be needed in the mixer block 202. The constant current outputs of the DAC 100, however, tend to limit the power efficiency in Tx path and tend to limit battery talk time of the wireless device.

Accordingly, there is a need to reduce the DC current of the Tx path in a wireless communication device using a baseband transmit DAC with code dependent DC current.

SUMMARY

Exemplary embodiments of the invention are directed to a transmit DAC with code dependent DC current which maintains the delivered output signal power level.

Accordingly, an embodiment of the invention can include a digital-to-analog converter that converts a digital signal of N bits having a set M of most significant bits and a set L of least significant bits to an analog signal. The N bits define a set of coded values. An input stage receives the digital signal and modifies the most significant bit of the set M of most significant bits. A first current source and a first plurality of switches are responsive to the set M of most significant bits. At least a second current source and a second plurality of switches are responsive to the set L of least significant bits. An output stage provides at least a first differential output signal and a second differential output signal. The output stage modifies the currents received from the first plurality of switches and the second plurality of switches, such that the value of the average output current of the first and second differential outputs signals is steered to a relatively low current value at the mid-point of the coded values.

Another embodiment can include a transmit channel of a wireless device, comprising: a digital-to-analog converter, configured to convert a digital signal of N bits having a set M of most significant bits and a set L of least significant bits to an analog signal, the N bits defining a set of coded values. The digital-to-analog converter comprises: an input stage configured to receive the digital signal and to modify the most significant bit of the set M of most significant bits; a first current source and a first plurality of switches responsive to the set M of most significant bits; at least a second current source and a second plurality of switches responsive to the set L of least significant bits; and an output stage, configured to provide at least a first differential output signal and a second differential output signal, said output stage configured to modify the currents received from the first plurality of switches and the second plurality of switches, such that the value of the average output current of the first and second differential outputs signals is steered to a relatively low current value at the mid-point of the coded values; a filter, responsive to the digital-to-analog converter, configured to filter the analog output signal of the digital-to-analog converter; and a mixer, configured to mix the filtered analog output signal of the digital-to-analog converter with a RF signal, to upconvert the analog output signal of the digital-to-analog converter to a modulated RF signal.

Another embodiment includes a method for converting a digital signal of N bits having a set M of most significant bits and a set L of least significant bits to an analog signal, the N bits defining a set of coded values. The method comprises: receiving the digital signal and modifying the most significant bit of the set M of most significant bits; and providing at least a first differential output signal and a second differential output signal from the digital signal, by steering the value of the average output current of the first and second differential outputs signals to a relatively low current value at the mid-point of the coded values.

Another embodiment of the invention can include a digital-to-analog converter, for converting a digital signal of N bits having a set M of most significant bits and a set L of least significant bits to an analog signal, the N bits defining a set of coded values, comprising: means for receiving the digital signal; means for modifying the most significant bit of the set M of most significant bits; and means for providing at least a first differential output signal and a second differential output signal from the digital signal, by steering the value of the average output current of the first and second differential outputs signals to a relatively low current value at the mid-point of the coded values.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
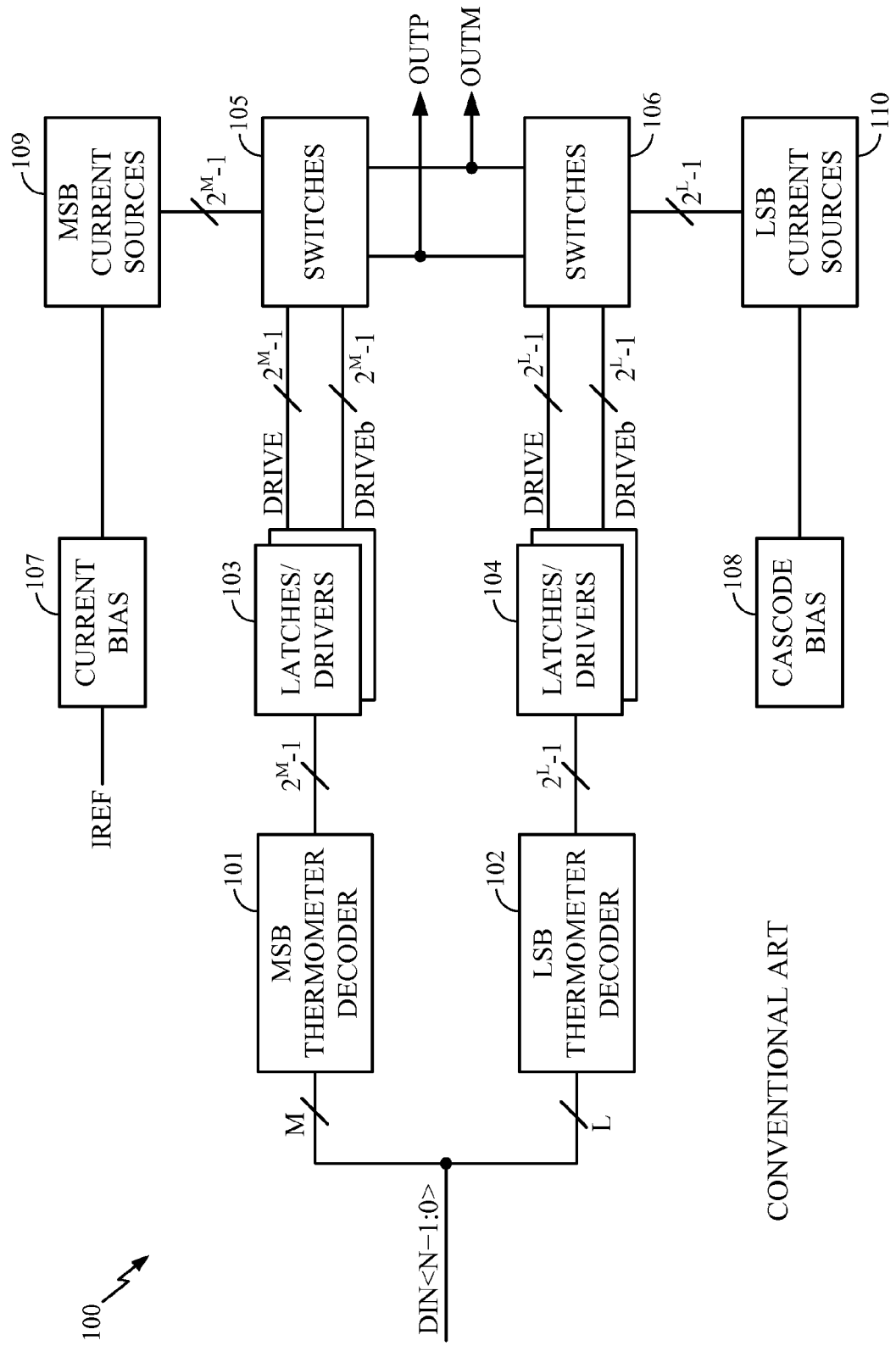
FIG. 1 is a block diagram of a conventional DAC.
Figure 2:
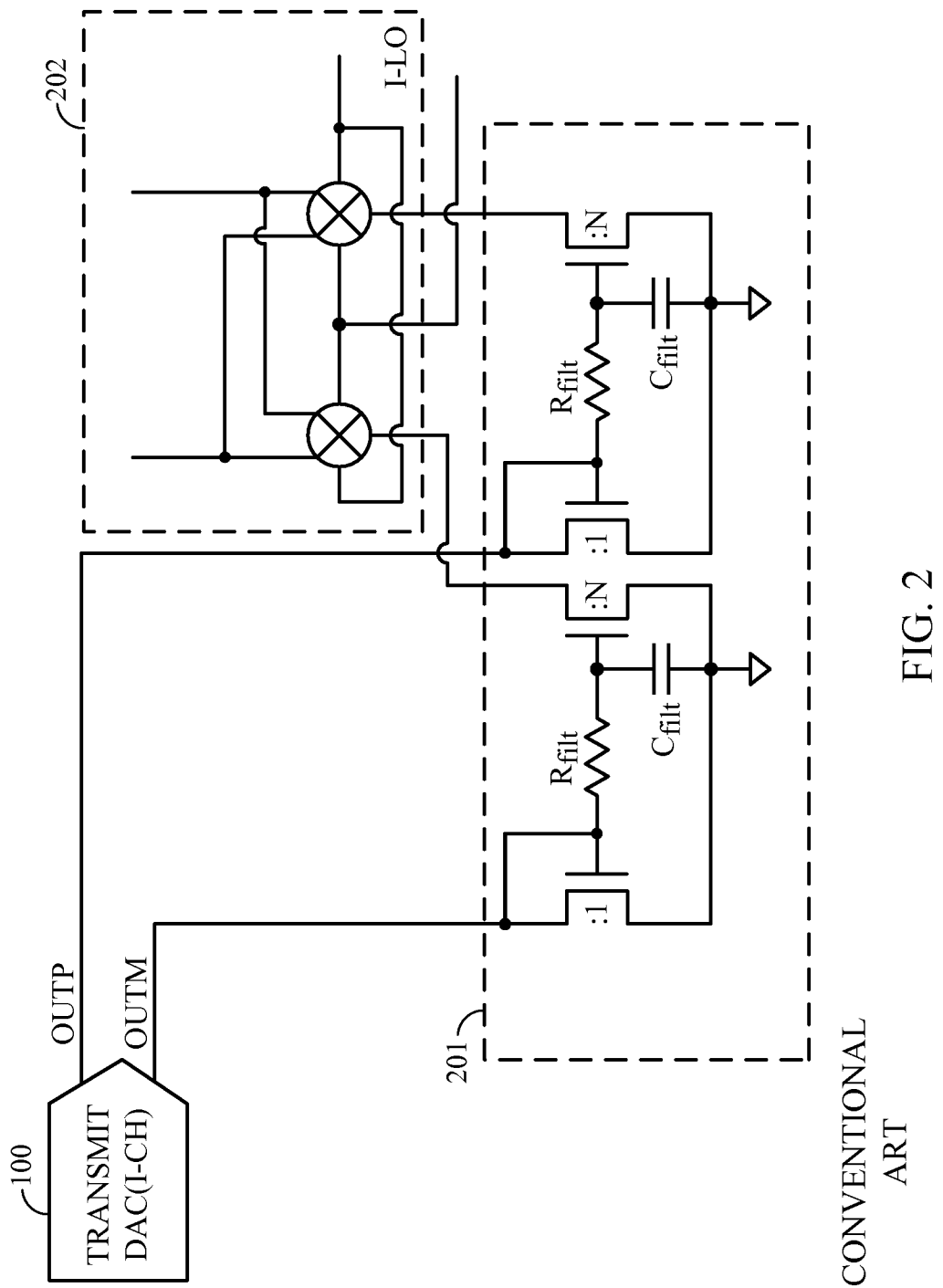
FIG. 2 is a simplified block diagram of a Tx channel having an RC filter and an up-conversion mixer.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary embodiments of the invention are directed to a transmit DAC with code dependent DC current which maintains the delivered output signal power level. More specifically, embodiments of the invention can achieve a code dependent DC current while maintaining substantially the same output signal power level as conventional DACs. Embodiments of the invention can achieve up to about 50 percent power reduction in a Tx path including a transmit DAC, baseband filter, and up-conversion mixer.

More specifically, embodiments of the invention are directed to a pseudo-differential class-AB DAC with code dependent DC current. The DAC converts a digital signal of N bits having a set M of most significant bits and a set L of least significant bits to an analog signal. The digital signal defines a set of coded values. The DAC includes an input stage for receiving the digital signal and modifying the most significant bit of the set M of the most significant bits (MSB). A first current source and a first plurality of switches are responsive to the set M of most significant bits. A second current source and a second plurality of switches are responsive to the set L of the least significant bits (LSB). An output stage provides at least a first differential output signal and a second differential output signal. The output stage modifies the currents received from the first plurality of switches and the second plurality of switches, such that the value of average output current of the first and second differential outputs signals is steered to a relatively low current value at the mid-point of the coded values.

Figure 3:
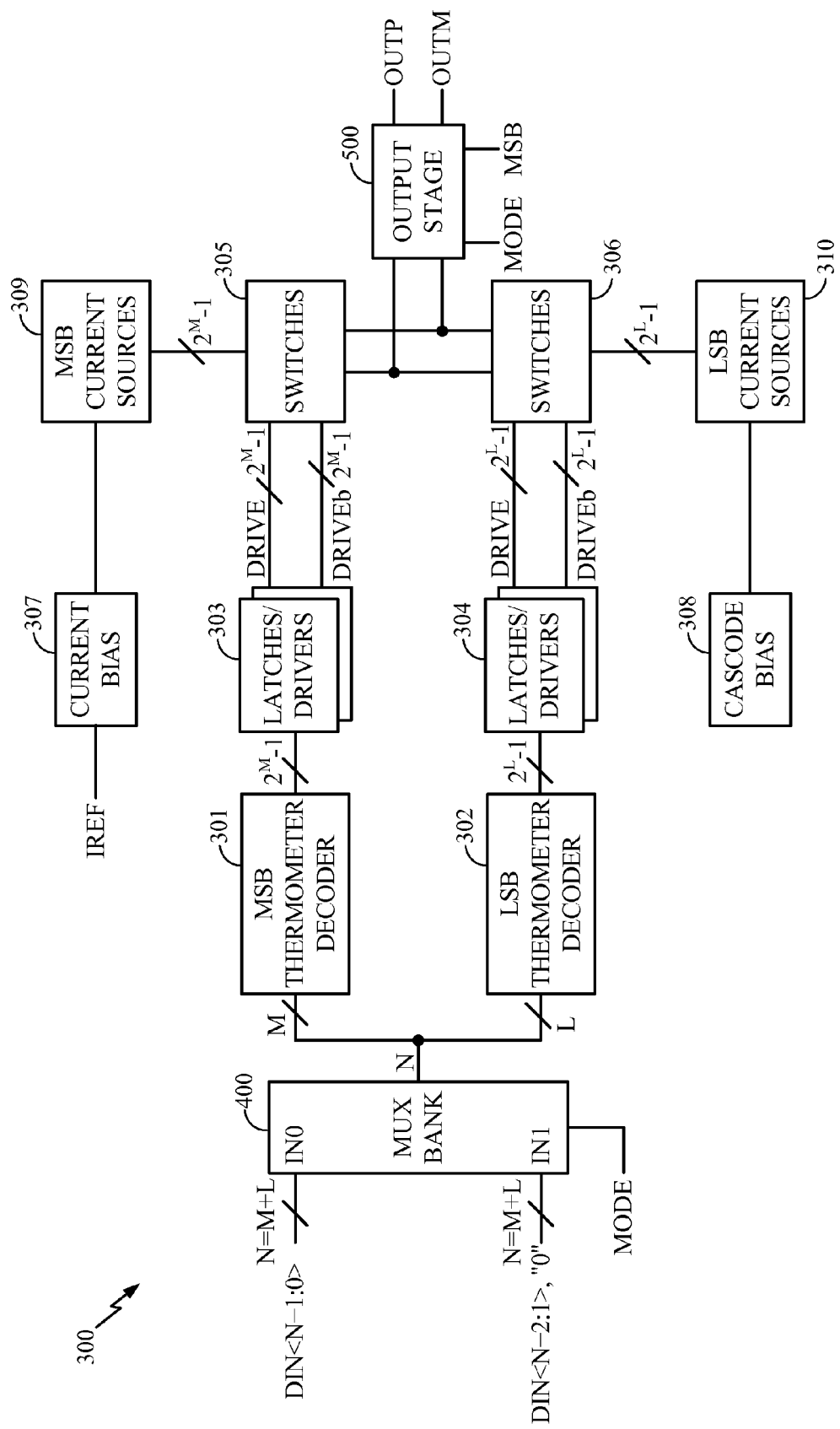
FIG. 3 is a block diagram of a pseudo-differential digital-to-analog converter.

Referring now to FIG. 3, a block diagram illustrates a pseudo-differential digital-to-analog converter 300. Like the conventional DAC of FIG. 1, the pseudo-differential digital-to-analog converter 300 is implemented with two thermometer-decoders 301 and 302. Thermometer-decoder 301 controls M most significant bits and thermometer-decoder 302 controls L least significant bits. The M bit section of DAC 300 includes latches/drivers 303, switches 305, a current bias 307 and a MSB current source 309, and the L bit section of DAC 300 includes latches/drivers 304, switches 306, a cascode bias 308 and a LSB current source 310. Unlike the conventional DAC 100, the DAC 300 of FIG. 3 includes a multiplexer bank 400 and an output stage 500.

The DAC 300 operates in two different modes which are referred to as mode 0 and mode 1. When the DAC 300 is in mode 0 it provides a fully differential (conventional) output. When the DAC 300 is in mode 1 it provides a pseudo-differential output. The modes are controlled by mode control data which is applied to both the mux bank 400 and the output stage 500.

The DAC 300 of FIG. 3 is a pseudo-differential class-AB DAC. If the M bit and L bit sections of DAC 300 are in mode 0, the DAC 300 operates in a fully-differential mode, and if the DAC 300 operates in mode 1, it is a pseudo-differential mode. The M bit and L bit sections of DAC 300 are fully reconfigurable to either mode. The pseudo-differential class-AB DAC 300 is not linear in a single-ended output mode, but it will maintain linearity as well as the signal power level when viewed in the differential output mode (see, e.g., FIGS. 6B and 6D). The pseudo-differential DAC 300 includes differential outputs OUTP and OUTM.

Figure 4A:
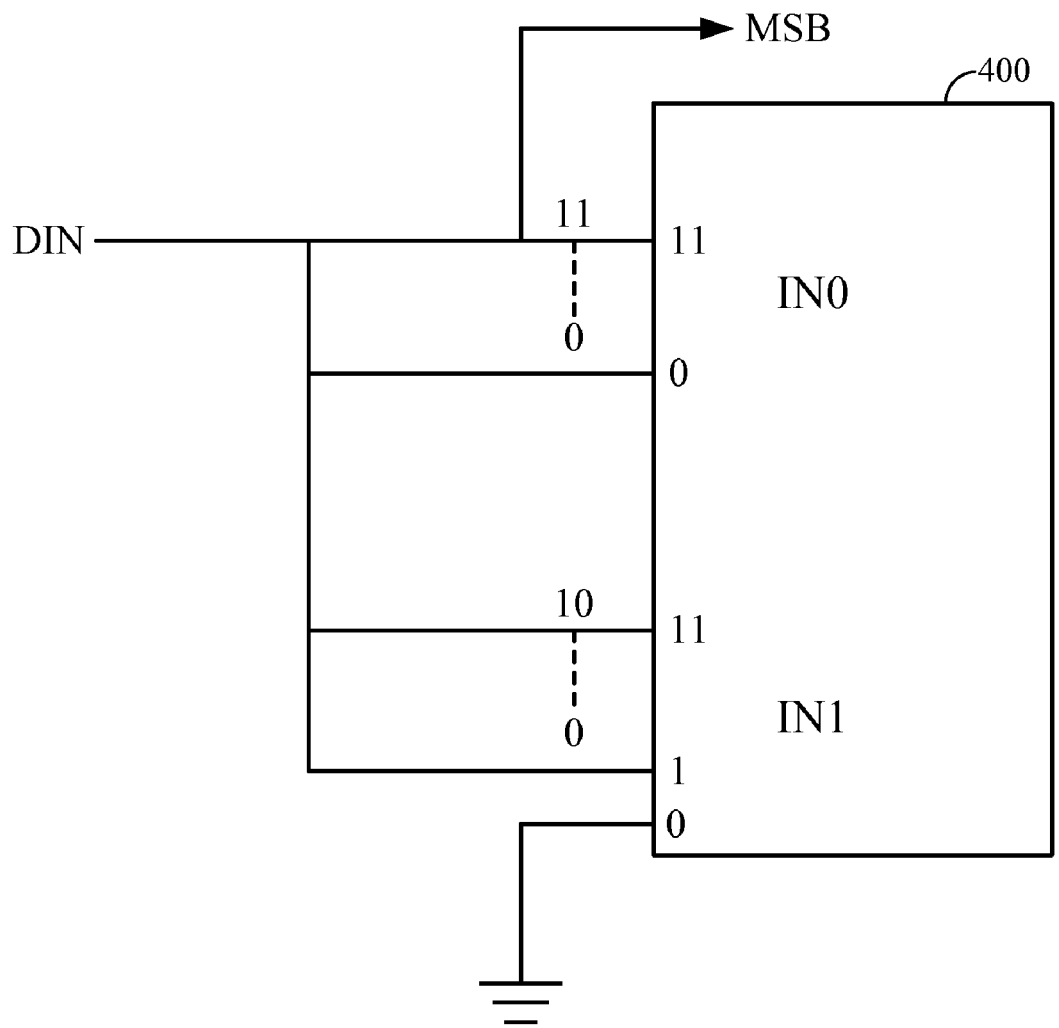
FIG. 4A is a more detailed block diagram of the multiplexer bank of FIG. 3.

Referring now to FIG. 4A, a more detailed block diagram illustrates the multiplexer bank 400 which includes a plurality of inverters which are designated as IN0 and IN1. The inverter IN0 receives twelve bits from the input signal DIN, and utilizes all twelve of the bits in the conventional mode or mode 0 with one bit being output as the MSB. In the pseudo differential mode or mode 1, the inverter IN1 also receives twelve bits from the input signal DIN, but only the eleven least significant bits are utilized. One bit is shunted to ground or to a predetermined voltage in order for the bit to assume either a fixed value of "0" or "1". The MSB is used as a control signal in the pseudo-differential mode, which will be discussed in greater detail below.

Figure 4B:
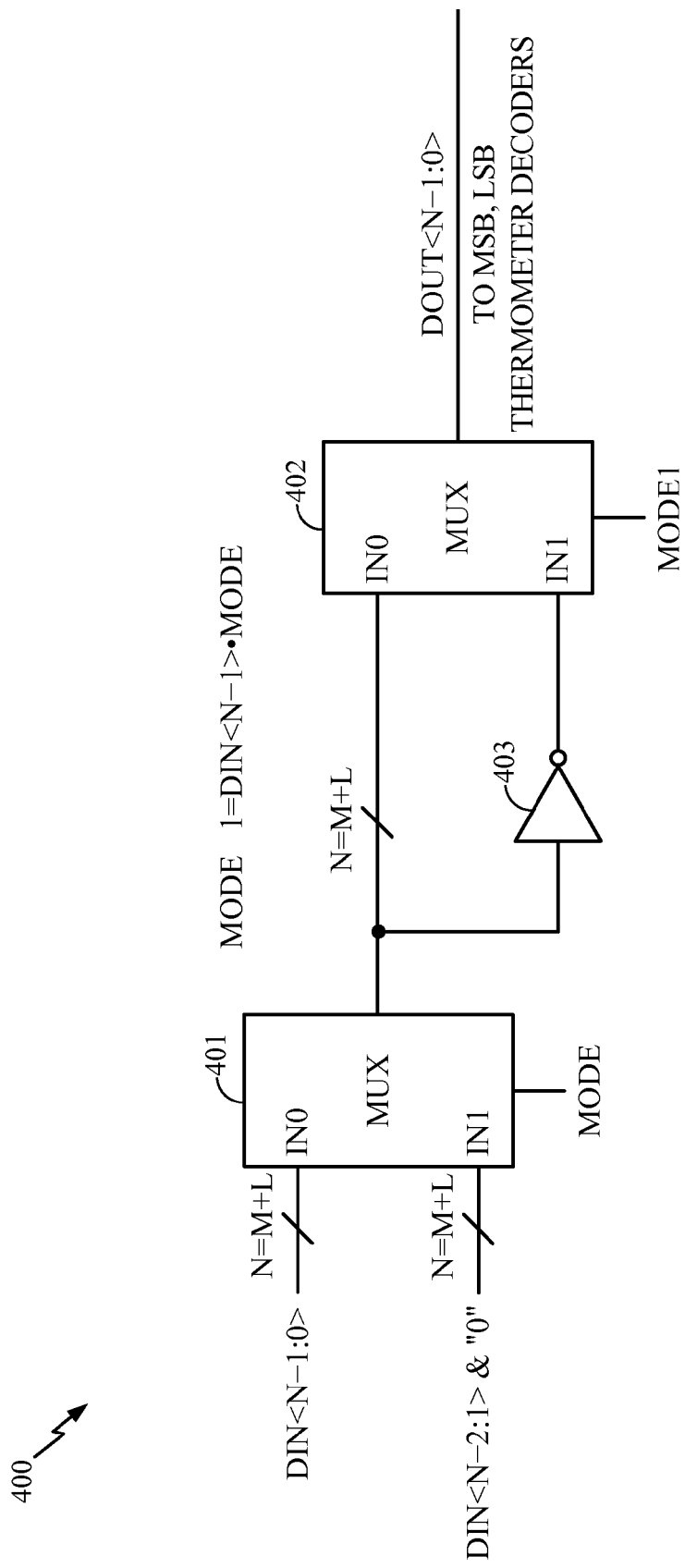
FIG. 4B is a detailed schematic diagram of the multiplexer bank at the input of the pseudo-differential digital-to-analog converter.

Referring now to FIG. 4B, a detailed schematic diagram illustrates additional details of the multiplexer bank 400 of the DAC 300. The multiplexer bank 400 may include a first multiplexer 401 and a second multiplexer 402. If the DAC 300 is in mode 0 or the conventional fully differential mode, and if the input signal DIN is a 12 bit input signal, then the full 12 bits of the input signal DIN are applied to the thermometer decoders 301, 302. If the DAC 300 is in mode 1 or the pseudo differential mode, and if the input signal DIN is a 12 bit input signal, then the MSB will be used as a control signal and the remaining eleven bits will be padded with a fixed value (e.g., "0" or "1") as the least significant bit. Accordingly, 11 bits of the input signal DIN plus a padded "0" or "1" will be applied to the thermometer decoders 301, 302 as the 12 bit input.

Figure 5:
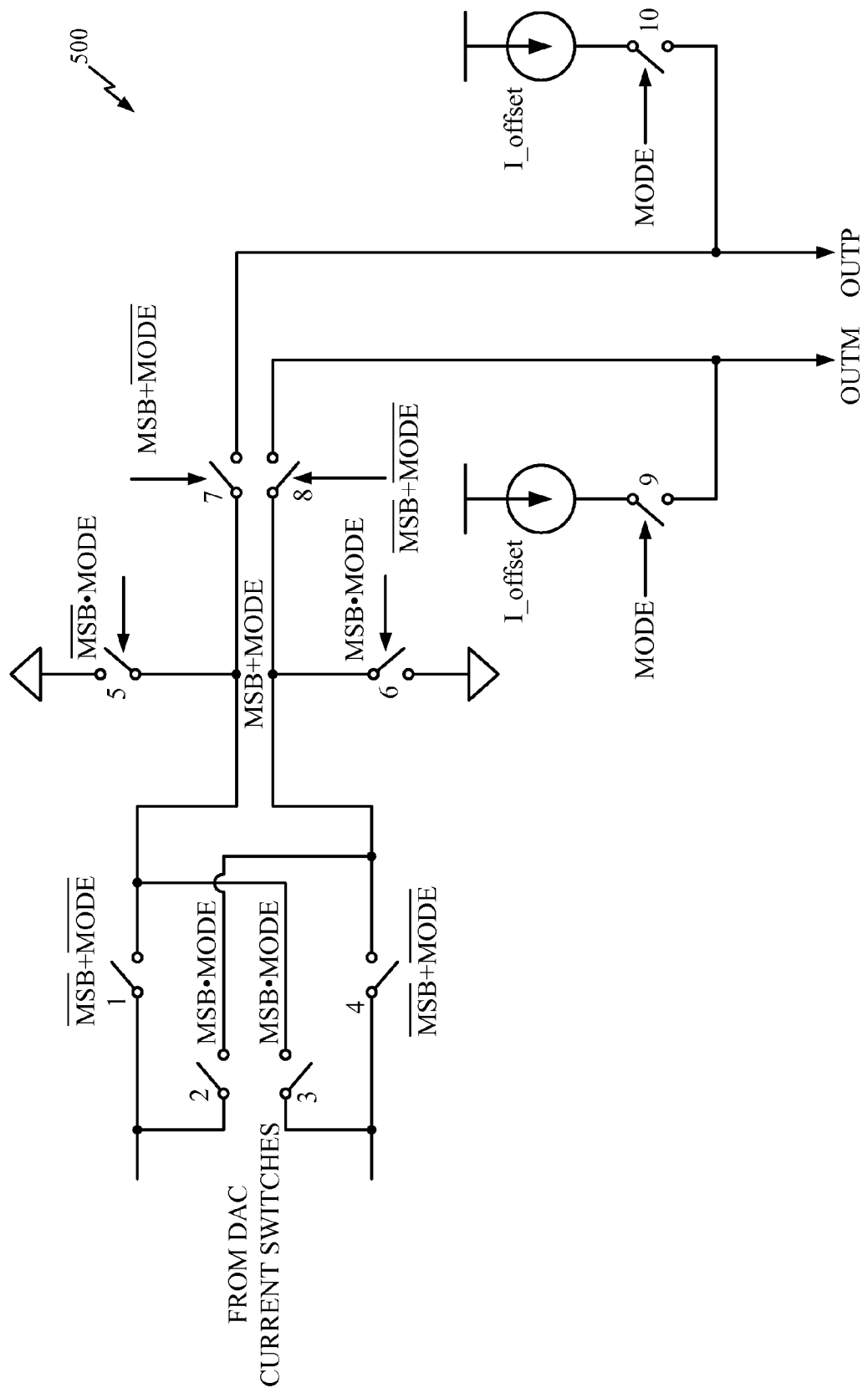
FIG. 5 is a detailed schematic diagram of the output stage of the pseudo-differential digital-to-analog converter.

Referring now to FIG. 5, a detailed schematic diagram illustrates the output stage 500 which can include switches SW1-SW10. The switches SW1-SW10 may be any type of switching device including CMOS switches. In the pseudo-differential mode, SW9, and SW10 provide the offset current $I_{\_offset}$ to the following stages such as filters 201 and mixers 202 to make them operate properly with enough DC bias currents near the cross-over point. The switches SW9 and SW10, however, are disabled in the fully-differential mode.

When the DAC 300 is operated in the pseudo-differential mode (Mode=1), if the MSB is "1", SW2, SW3, SW6, SW7, SW9 and SW10 are on, all the other switches are in an off-state. When the DAC 300 is operated in a pseudo-differential mode (Mode=1), if the MSB is "0", SW1, SW4, SW5, SW8, SW9 and SW10 are on, all other switches are in an off-state. If there was no offset current, the average DC current of the DAC 300 operating in the pseudo-differential mode would be about 50 percent of the conventional fully-differential DAC. However, the average DC current of the DAC 300 operating in the pseudo-differential mode will be little more due to the added offset current from SW9 and SW10.

It should be noted that there is a discontinuity in the single-ended output of the pseudo-differential DAC which is coincident to the bit change of the MSB. This situation can generate a cross-over disturbance at the code midpoint. The pseudo-differential DAC 300 can be operated with a fully-thermometer decoded behavior to improve the cross-over distortion that usually exists in any class-AB circuits. Further, in the pseudo-differential mode reduced cross-over disturbance is achieved from the mux bank 400 and output stage 500. In mode 1 and with MSB=1, the second mux 402 of FIG. 4B selects the inverted output (e.g., from inverter 403) of the first mux 401 to maintain the thermometer decoded behavior during the MSB change (e.g., at the midpoint of the coded values). This arrangement reduces the cross-over disturbance by generating a complementary output when the MSB=1 and the mode=1. The complementary analog output is compensated for in the output stage. For example, SW1, 2, 3, and 4, as illustrated in FIG. 5, can be used to compensate for the various operating modes. In particular for the cross-over state (when Mode=1, MSB=1) SW2 and SW3 will be closed and SW1 and SW4 will be open to invert the outputs from the LSB and MSB sections of the DAC 300.

In the pseudo-differential mode (Mode=1), the first mux 401 takes the 1-bit shifted data from LSB to MSB. The original MSB is used as explained herein as a control signal. The new LSB will be filled by a fixed value (e.g., "0" or "1") as explained above. Also in pseudo-differential mode (Mode=1), the inverter 403 and second mux 402 are used to reduce the cross-over disturbance during the MSB transition, which is discussed in greater detail below.

For example, in a 4-bit DAC, operating in Mode=1, suppose the MSB makes a low to high transition at the code midpoint (Data: 0111 to 1000). If the data has taken the non-inverted path to IN0 of the second mux 402, there is a relatively large code change data, since the input data (stripped of the MSB and padded with a 0) changes from 1110 to 0000. This is undesirable and is likely to cause a relatively large glitch or disturbance in the current output. On the other hand, if the data takes the inverted path through inverter 403 to IN1 of the second mux 402, there is a relatively small code change data, since the data changes from 1110 to 1111, and there is only a one bit change which will cause a substantially smaller disturbance during the cross-over of the MSB. As discussed above, the inverted input signal in Mode 1 is compensated for in the output section for the cross-over state (when Mode=1, MSB=1) SW2 and SW3 will be closed and SW1 and SW4 will be open to invert the outputs from the LSB and MSB sections of the DAC 300.

Figure 6B:
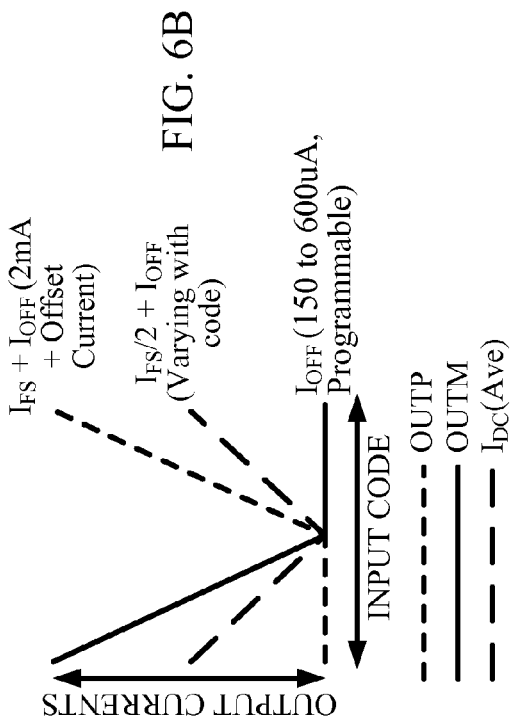
FIG. 6B is a chart depicting the output currents of the pseudo-differential digital-to-analog converter.
Figure 6D:
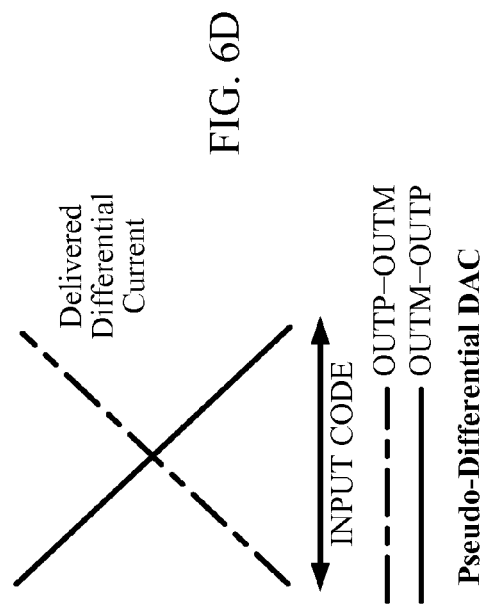
FIG. 6D is a chart depicting the signal power of the pseudo-differential digital-to-analog converter.
Figure 6A:
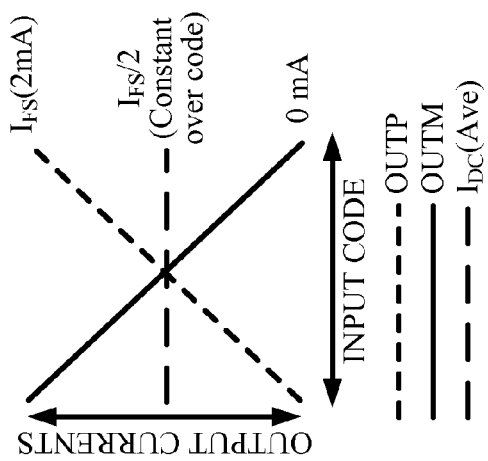
FIG. 6A is a chart depicting the output currents of a conventional fully differential digital-to-analog converter.
Figure 6C:
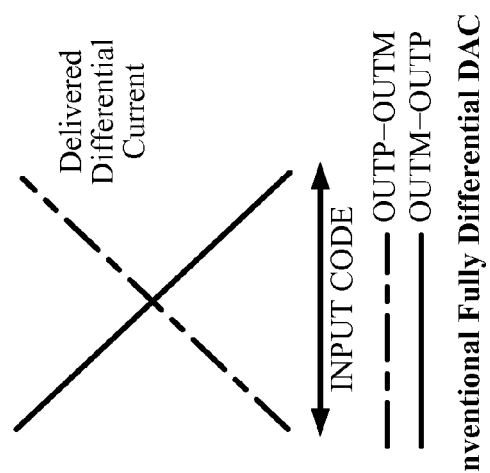
FIG. 6C is a chart depicting the signal power of a conventional fully differential digital-to-analog converter.

Referring now to FIGS. 6A-6D, a series of charts depict the performance of the conventional fully differential DAC and the pseudo-differential DAC of embodiments of the invention. FIGS. 6A and 6C relate to the fully differential DAC, and FIGS. 6B and 6D relate to the pseudo-differential DAC. In FIG. 6A, it can be appreciated that the output currents of the differential signals OUTP and OUTM in a fully differential DAC vary in opposite directions over the entire range of input codes and that average output current is constant. In FIG. 6B, it can be appreciated that the output currents of the differential signals OUTP and OUTM in a pseudo-differential DAC are held to an offset value (e.g., $I_{OFF}$) over half the range of the input codes, and that output currents vary from the offset value to a full scale value over the other half of the range of input codes. Accordingly, the value of the average output current of signals OUTP and OUTM in a pseudo-differential DAC is steered to a relatively low current value at the midpoint of the coded values. From FIGS. 6C and 6D, it can be appreciated that the actual delivered differential current is substantially the same for both the conventional fully differential DAC and the pseudo-differential DAC.

As discussed above DACs can be used in wireless devices and in particular in the transmit path. Accordingly, an embodiment of the invention can include a transmit channel of a wireless device including a digital-to-analog converter, configured to convert a digital signal of N bits having a set M of most significant bits and a set L of least significant bits to an analog signal, the N bits defining a set of coded values. The digital-to-analog converter can include an input stage configured to receive the digital signal and to modify the most significant bit of the set M of most significant bits. A first current source and a first plurality of switches responsive to the set M of most significant bits and at least a second current source and a second plurality of switches responsive to the set L of least significant bits are provided. An output stage is configured to provide at least a first differential output signal and a second differential output signal. The output stage is also configured to modify the currents received from the first plurality of switches and the second plurality of switches, such that the value of the average output current of the first and second differential outputs signals is steered to a relatively low current value at the mid-point of the coded values. A filter, responsive to the digital-to-analog converter, is configured to filter the analog output signal of the digital-to-analog converter. A mixer is configured to mix the filtered analog output signal of the digital-to-analog converter with a RF signal, to upconvert the analog output signal of the digital-to-analog converter to a modulated RF signal.

The information and signals discussed herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. the described functionality may be implemented in varying ways for each particular application, but such implementation decisions should not be interpreted as causing a departure from the scope of the embodiments of the invention.

From the foregoing description, it will be appreciated that embodiments of the invention can include methods for performing the functions, sequence of actions, steps and/or algorithms discussed herein. For example, an embodiment can include a method for converting a digital signal of N bits having a set M of most significant bits and a set L of least significant bits to an analog signal, the N bits defining a set of coded values. The method can include receiving the digital signal and modifying the most significant bit of the set M of most significant bits. At least a first differential output signal and a second differential output signal is provided from the digital signal, by steering the value of the average output current of the first and second differential outputs signals to a relatively low current value at the mid-point of the coded values.

Accordingly, the invention is not limited to the illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. Further, the functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A digital-to-analog converter, configured to convert a digital signal of N bits having a set M of most significant bits and a set L of least significant bits to an analog signal, the N bits defining a set of coded values, comprising:

an input stage configured to receive the digital signal and modifying the most significant bit of the set M of most significant bits;
a first current source and a first plurality of switches responsive to the set M of most significant bits;
at least a second current source and a second plurality of switches responsive to the set L of least significant bits; and
an output stage, configured to provide at least a first differential output signal and a second differential output signal, said output stage configured to modify the currents received from the first plurality of switches and the second plurality of switches, such that the value of the average output current of the first and second differential outputs signals is steered to a relatively low current value at the mid-point of the coded values.

2. The digital-to-analog converter according to claim 1, further comprising:
a first thermometer decoder and a second thermometer decoder responsive to an output of the input stage and configured to apply decoded signals to the first plurality of switches and the second plurality of switches.

3. The digital-to-analog converter according to claim 2, further comprising:
a first plurality of latches between the input stage and the first plurality of switches and a second plurality of latches between the input stage and the second plurality of switches.

4. The digital-to-analog converter according to claim 3, wherein a bias current sets the current of the first current source, and a cascode bias sets the current of the second current source.

5. The digital-to-analog converter according to claim 1, wherein the output stage comprises:
a third plurality of switches configured to steer the output current of the first plurality of switches to ground based on a first value of the most significant bit and to steer the output of the second plurality of switches to ground based on a second value of the most significant bit and wherein the third plurality of switches are further configured to add an offset current to the output currents of the first and second differential output signals.

6. The digital-to-analog converter according to claim 1, wherein the input stage comprises:
a first multiplexer for receiving the digital signal; and
an inverter for inverting an output of the first multiplexer.

7. The digital-to-analog converter according to claim 1, wherein one of the differential output signals is steered to the relatively low current value for a predetermined range of coded values, while the other differential output signal is varied across the full range of coded values.

8. The digital-to-analog converter according to claim 7 wherein the predetermined range of coded values extends from the beginning to the mid-point of the coded values, and the differential output that is steered to the relatively low current value across the predetermined range is steered from the relatively low current value to the full scale value from the mid-point to the end of the coded values.

9. The digital-to-analog converter according to claim 1 wherein the input stage and the output stage are responsive to a mode signal defining at least first and second modes, such that in a first mode the output currents of the first and second differential outputs signals are steered to the relatively low current value at the mid-point of the coded values, and in a second mode the output currents of the first and second differential outputs signals are steered in opposite directions over the full range of coded values.

10. A wireless device having a transmit channel, comprising:
   a digital-to-analog converter configured to convert a digital signal of N bits having a set M of most significant bits and a set L of least significant bits to an analog signal, the N bits defining a set of coded values, comprising:
      an input stage configured to receive the digital signal and to modify the most significant bit of the set M of most significant bits;
      a first current source and a first plurality of switches responsive to the set M of most significant bits;
      at least a second current source and a second plurality of switches responsive to the set L of least significant bits; and
      an output stage configured to provide at least a first differential output signal and a second differential output signal, said output stage modifying the currents received from the first plurality of switches and the second plurality of switches, such that the value of the average output current of the first and second differential outputs signals is steered to a relatively low current value at the mid-point of the coded values;
   a filter, responsive to the digital-to-analog converter, configured to filter the analog output signal of the digital-to-analog converter; and
   a mixer configured to mix the filtered analog output signal of the digital-to-analog converter with a RF signal to upconvert the analog output signal of the digital-to-analog converter to a modulated RF signal.

11. The wireless device according to claim 10, further comprising:
   a first thermometer decoder and a second thermometer decoder responsive to an output of the input stage and configured to apply decoded signals to the first plurality of switches and the second plurality of switches.

12. The wireless device according to claim 11, further comprising:
   a first plurality of latches between the input stage and the first plurality of switches and a second plurality of latches between the input stage and the second plurality of switches.

13. The wireless device according to claim 12, wherein a bias current sets the current of the first current source, and a cascode bias sets the current of the second current source.

14. The wireless device according to claim 10, wherein the output stage comprises:
   a third plurality of switches configured to steer the output current of the first plurality of switches to ground based on a first value of the most significant bit and to steer the output of the second plurality of switches to ground based on a second value of the most significant bit and wherein the third plurality of switches are further configured to add an offset current to the output currents of the first and second differential output signals.

15. The wireless device according to claim 10 wherein the input stage comprises:
   a first multiplexer for receiving the digital signal; and
   an inverter for inverting an output of the first multiplexer.

16. The wireless device according to claim 10 wherein one of the differential output signals is steered to the relatively low current value for a predetermined range of coded values, while the other differential output signal is varied across the full range of coded values.

17. The wireless device according to claim 16 wherein the predetermined range of coded values extends from the beginning to the mid-point of the coded values, and the differential output that is steered to the relatively low current value across the predetermined range is steered from the relatively low current value to the full scale value from the mid-point to the end of the coded values.

18. The wireless device according to claim 10 wherein the input stage and the output stage are responsive to a mode signal defining at least first and second modes, such that in a first mode the output currents of the first and second differential outputs signals are steered to the relatively low current value at the mid-point of the coded values, and in a second mode the output currents of the first and second differential outputs signals are steered in opposite directions over the full range of coded values.

19. A method, for converting a digital signal of N bits having a set M of most significant bits and a set L of least significant bits to an analog signal, the N bits defining a set of coded values, comprising:
   receiving the digital signal and modifying the most significant bit of the set M of most significant bits; and
   providing at least a first differential output signal and a second differential output signal from the digital signal, by steering the value of the average output current of the first and second differential outputs signals to a relatively low current value at the mid-point of the coded values.

20. The method according to claim 19 further comprising:
   steering one of the differential output signals to the relatively low current value for a predetermined range of coded values, while the other differential output signal is varied across the predetermined range of coded values.

21. The method according to claim 20 wherein the predetermined range of coded values extends from the beginning to the mid-point of the coded values, and the differential output that is steered to the relatively low current value across the predetermined range is steered from the relatively low current value to a full scale value from the mid-point to the end of the coded values.

22. A digital-to-analog converter, for converting a digital signal of N bits having a set M of most significant bits and a set L of least significant bits to an analog signal, the N bits defining a set of coded values, comprising:
   means for receiving the digital signal;
   means for modifying the most significant bit of the set M of most significant bits; and
   means for providing at least a first differential output signal and a second differential output signal from the digital signal, by steering the value of the average output current of the first and second differential outputs signals to a relatively low current value at the mid-point of the coded values.

* * * * *